United States Patent
Nagayama et al.

(10) Patent No.: US 11,909,619 B2
(45) Date of Patent: Feb. 20, 2024

(54) ESTIMATION DEVICE, ESTIMATION METHOD AND ESTIMATION PROGRAM

(71) Applicant: NIPPON TELEGRAPH AND TELEPHONE CORPORATION, Tokyo (JP)

(72) Inventors: Hiroki Nagayama, Musashino (JP); Bo Hu, Musashino (JP); Shingo Kashima, Musashino (JP); Kazunori Kamiya, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 413 days.

(21) Appl. No.: 17/288,238

(22) PCT Filed: Nov. 13, 2019

(86) PCT No.: PCT/JP2019/044519
§ 371 (c)(1),
(2) Date: Apr. 23, 2021

(87) PCT Pub. No.: WO2020/121722
PCT Pub. Date: Jun. 18, 2020

(65) Prior Publication Data
US 2021/0392067 A1      Dec. 16, 2021

(30) Foreign Application Priority Data

Dec. 13, 2018   (JP) .................................. 2018-233810

(51) Int. Cl.
*H04L 1/00*      (2006.01)
*H04L 43/16*     (2022.01)
(Continued)

(52) U.S. Cl.
CPC .............. *H04L 43/16* (2013.01); *G05B 11/26* (2013.01); *H03K 5/19* (2013.01); *H04L 43/08* (2013.01)

(58) Field of Classification Search
CPC ....... H04L 43/16; H04L 43/08; H04L 7/0087; H03K 5/19; G01S 13/22
(Continued)

(56) References Cited

U.S. PATENT DOCUMENTS 8,234,035 B2 * 7/2012 Iwagami ............. G06F 11/0739
  701/30.9
2022/0103336 A1 * 3/2022 Nagayama ............ H04L 7/0087

OTHER PUBLICATIONS

Nishiguchi et al., "Improved Algorithm for Estimating Pulse Repetition Intervals", IEEE Transactions on Aerospace and Electronic Systems, vol. 36, No. 2, Jan. 3, 2000, pp. 407-421.
(Continued)

*Primary Examiner* — Khai Tran
(74) *Attorney, Agent, or Firm* — XSENSUS LLP

(57) ABSTRACT

An aggregation unit (15a) aggregates an input pulse train signal including a time-series pulse corresponding to a predetermined observation time into pulses for respective unit times. A calculation unit (15b) calculates a time shift amount of an autocorrelation function using the aggregated pulse train signal. A detection unit (15c) calculates an autocorrelation value and a threshold with respect to each of time shift amounts selected in ascending order from the calculated time shift amount and detects the time shift amount as a period of the aggregated pulse train signal when the autocorrelation value exceeds the threshold. A conversion unit (15d) converts the detected period to a period of the input pulse train signal using the unit time. An exclusion unit (15e) excludes the pulse train signal having the converted period from the input pulse train signal.

15 Claims, 5 Drawing Sheets

(51) Int. Cl.
  *H04L 43/08* (2022.01)
  *G05B 11/26* (2006.01)
  *H03K 5/19* (2006.01)
(58) Field of Classification Search
  USPC .......................................................... 375/346
  See application file for complete search history.

(56) References Cited

OTHER PUBLICATIONS

Nishiguchi, "Time-Period Analysis for Pulse Train Deinterleaving", Trans. of the Society of Instrument and Control Engineers, vol. vol. E-4, No. 1, Jan. 2005, pp. 68-78.

* cited by examiner

ESTIMATION DEVICE, ESTIMATION METHOD AND ESTIMATION PROGRAM

CROSS-REFERENCE TO RELATED APPLICATIONS

The present application is based on PCT filing PCT/JP2019/044519, filed Nov. 13, 2019, which claims priority to JP 2018-233810, filed Dec. 13, 2018, the entire contents of each are incorporated herein by reference.

TECHNICAL FIELD

The present invention relates to an estimation device, an estimation method, and an estimation program.

BACKGROUND ART

Conventionally, techniques called PRI (Pulse Repetition Intervals) transform for estimating the period of pulse train signals are known (see NPL 1 and NPL 2). In PRI transform, a phase term represented by a complex number is added to an autocorrelation function which calculates how much a signal matches a time-shifted signal thereof and which is broadly used for period estimation. In PRI transform, the complex term is added to suppress the influence of noise called subharmonics generated in a pulse train signal.

CITATION LIST

Non Patent Literature

[NPL 1] Ken'ichi Nishiguchi, et al, "Improved Algorithm for Estimating Pulse Repetition Intervals", IEEE Transactions on Aerospace and Electronic Systems, April 2000, Volume 36, Issue 2, Page 407-421

[NPL 2] Ken'ichi Nishiguchi, "Time-Period Analysis for Pulse Train Deinterleaving", Trans. of the Society of Instrument and Control Engineers, 2005, Vol. E-4, No. 1, pp. 68-78

SUMMARY OF THE INVENTION

Technical Problem

However, in the conventional techniques, it is often difficult to estimate the period of each pulse train of a signal including pulse trains having a plurality of periods. For example, an autocorrelation value of a pulse train signal is determined by the percentage of the number of pulses overlapping an original signal when the pulse train signal is time-shifted. Therefore, when signals having a plurality of periods with a large period difference are included in a pulse train signal, the shorter the period of the signal, the larger the autocorrelation value when the signal is time-shifted by period A and more easily it is distinguished from noise. In contrast, the longer the period of the signal included in the pulse train signal, the smaller the autocorrelation value, and more difficult it is distinguished from noise. Therefore, in PRI transform, when signals having a plurality of periods with a large period difference are included in the pulse train signal, it is often difficult to estimate the period of a signal having a long period.

The present invention has been made to solve the above-described problems, and an object thereof is to estimate each period of pulse train signals including signals having a plurality of periods with high accuracy.

Means for Solving the Problem

In order to solve the problems and attain the object, an estimation device according to the present invention includes: an aggregation unit that aggregates an input pulse train signal including a time-series pulse corresponding to a predetermined observation time into pulses for respective unit times; a calculation unit that calculates a time shift amount of an autocorrelation function using the aggregated pulse train signal; a detection unit that calculates an autocorrelation value and a threshold with respect to each of time shift amounts selected in ascending order from the calculated time shift amount and detects the time shift amount as a period of the aggregated pulse train signal when the autocorrelation value exceeds the threshold; a conversion unit that converts the detected period to a period of the input pulse train signal using the unit time; and an exclusion unit that excludes the pulse train signal having the converted period from the input pulse train signal.

Effects of the Invention

According to the present invention, it is possible to estimate each period of pulse train signals including signals having a plurality of periods with high accuracy.

DESCRIPTION OF EMBODIMENTS

Figure 1:
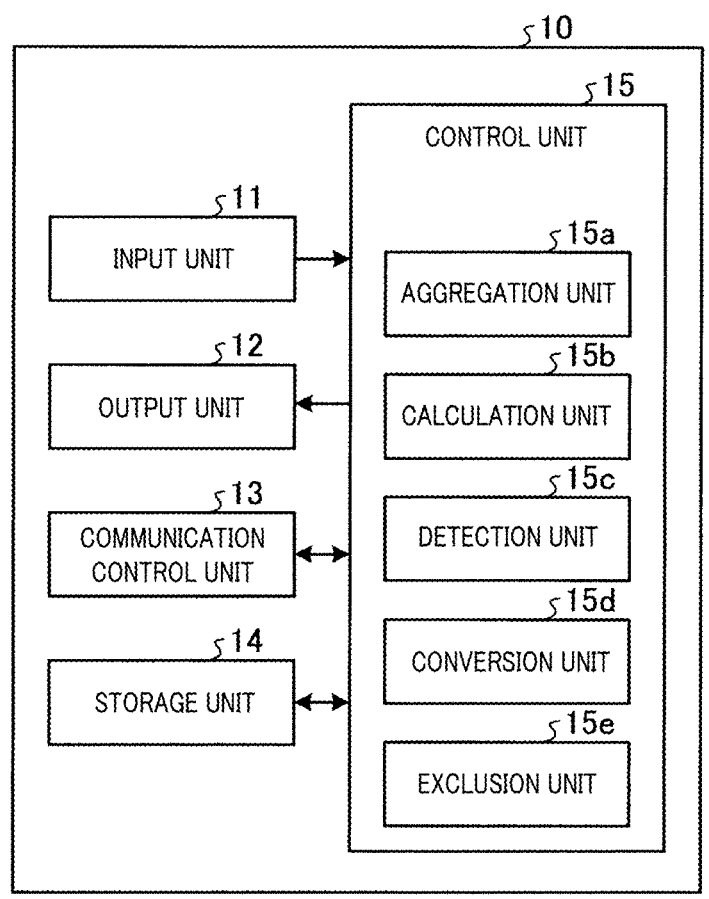
FIG. 1 is a schematic diagram illustrating a schematic configuration of an estimation device according to a present embodiment.

Hereinafter, an embodiment of the present invention will be described in detail with reference to the drawings. However, the present invention is not limited to this embodiment. In the drawings, the same elements are denoted by the same reference numerals.

[Configuration of Estimation Device]

FIG. 1 is a schematic diagram illustrating a schematic configuration of an estimation device according to a present embodiment. As illustrated in FIG. 1, an estimation device 10 is realized as a general-purpose computer such as a personal computer and includes an input unit 11, an output unit 12, a communication control unit 13, a storage unit 14, and a control unit 15.

The input unit 11 is realized using an input device such as a keyboard or a mouse and inputs various pieces of instruction information such as start of processing to the control unit 15 according to an input operation of an operator. The output unit 12 is realized as a display device such as a liquid crystal display, a printing device such as printer, and the like.

The communication control unit 13 is realized as a NIC (Network Interface Card) or the like and controls communication with the control unit 15 and an external device via an electric telecommunication line such as a LAN (Local Area Network) or the Internet. For example, the communication control unit 13 controls communication with the control unit 15 and a management device or the like that collects and manages a pulse train signal used in an estimation process to be described later.

The storage unit 14 is realized as a semiconductor memory device such as a RAM (Random Access Memory) or a Flash Memory or a storage device such as a hard disk or an optical disc. For example, the periods detected in the estimation process to be described later and the like are stored in the storage unit 14. The storage unit 14 may communicate with the control unit 15 via the communication control unit 13.

The control unit 15 is realized using such as a CPU (Central Processing Unit) and executes a processing program stored in a memory. In this way, the control unit 15 functions as an aggregation unit 15a, a calculation unit 15b, a detection unit 15c, a conversion unit 15d, and an exclusion unit 15e as illustrated in FIG. 1. These functional units may be implemented in different hardware components, respectively or in part.

The aggregation unit 15a aggregates an input pulse train signal including a time-series pulse corresponding to a predetermined observation time into pulses for respective predetermined unit times. That is, the aggregation unit 15a converts the scale of a pulse train signal corresponding to an observation time such as three hours (hereinafter referred to as an "input pulse train signal"), for example, input as an estimation processing target of the estimation device 10 to a predetermined unit time to be described later in units of seconds, for example, to obtain an aggregated pulse train signal.

Specifically, first, the aggregation unit 15a receives the input of a pulse train signal corresponding to a predetermined observation time via the input unit 11 or the communication control unit 13. For example, the aggregation unit 15a receives collected IP communication packets for respective combinations of (src IP, dst IP, and dst port) as an estimation processing target.

The aggregation unit 15a generates an input pulse train signal which is time-series data in which the horizontal axis is time t and the vertical axis is the number of packets using the received pulse train signal corresponding to the observation time. Here, the observation time is the time from the generation time point of the first pulse of the input pulse train signal to the generation time point of the last pulse. The input pulse train signal is represented by the presence/absence of a pulse at time point t and the number thereof. For example, the input pulse train signal is represented by a point corresponding to the number of pulses at a generation time point of the pulse or a number of bars the same as the number of pulses, indicating generation of pulses (see FIG. 3(a) to be described later).

Subsequently, the aggregation unit 15a aggregates the pulse intervals of the input pulse train signal and calculates the most frequent value. The aggregation unit 15a determines the unit times on the basis of the most frequent value of the pulse intervals of the input pulse train signal and aggregates the input pulse train signal for respective unit times. That is, the aggregation unit 15a determines the unit times using the calculated most frequent value and converts the scale of the input pulse train signal using the determined unit times.

In the present embodiment, the aggregation unit 15a determines a value of 20% of the most frequent value of the pulse intervals of the input pulse train signal in order to absorb the jitter of the packet generation timings. The aggregation unit 15a aggregates the input pulse train signal for respective determined unit times and obtains an aggregated pulse train signal.

The calculation unit 15b calculates a time shift amount of an autocorrelation function using the aggregated pulse train signal. Specifically, the calculation unit 15b calculates the pulse intervals of all patterns included in the aggregated pulse train signal as a time shift amount.

Here, as described above, the autocorrelation function is a function which calculates how much a signal matches a predetermined time-shifted signal thereof. The autocorrelation function is represented as a function of a time shift amount $\tau$ as illustrated in Formula (1).

[Formula 1]

$$\int g(t)g(t+\tau)dt \qquad (1)$$

Here, $g(t)g(t+\tau)$ represents the number of overlapping pulses among the number of pulses at time point t and the number of pulses at time point $(t+\tau)$.

As illustrated in Formula (1), since an autocorrelation value has a significantly large value when the time shift amount $\tau$ is identical to the period of a periodic function, the autocorrelation value can be used for estimation of the period of a periodic function. The pulse interval that is not in the aggregated pulse train signal does not become a period. Therefore, in the present embodiment, the calculation unit 15b enumerates the pulse intervals of all patterns of the aggregated pulse train signal as the period candidates of the pulse train signal and sets the respective pulse intervals as time shift amounts.

The detection unit 15c calculates an autocorrelation value and a threshold with respect to each of the time shift amounts selected in ascending order from the calculated time shift amounts and detects the time shift amount as the period of the aggregated pulse train signal when the autocorrelation value exceeds the threshold.

Specifically, the detection unit 15c selects the calculated time shift amount as a processing target in ascending order and substitutes the selected time shift amount $\tau$ into Formula (1) to thereby calculate an autocorrelation value with respect to the time shift amount $\tau$.

The detection unit 15c calculates a threshold using a value obtained by dividing the observation time by the time shift amount $\tau$. Specifically, since the observation time of the input pulse train signal is equal to the time from generation of the first pulse of an aggregated pulse train signal to generation of the last pulse, the detection unit 15c uses the time as an observation time and divides the observation time by the time shift amount $\tau$.

As understood from Formula (1), the autocorrelation value of the pulse train signal with respect to the time shift amount $\tau$ is identical to the number of pulses having the period $\tau$ present in the pulse train signal. The value obtained by dividing the observation time by the time shift amount $\tau$ is the number of pulses of the pulse train signal having the period $\tau$ that must be present in the pulse train signal corresponding to the observation time. Therefore, when the pulse train signal having the period $\tau$ is present in the pulse train signal corresponding to the observation time, the autocorrelation value will be larger than this value.

When loss of pulses is allowed up to 20%, the detection unit 15c calculates a value obtained by multiplying a value obtained by dividing the observation time by the time shift amount $\tau$ by 0.8 as a threshold. When the autocorrelation value with respect to the time shift amount $\tau$ exceeds the threshold, the detection unit 15c determines that a pulse train having the period τ is present.

When the autocorrelation value with respect to the time shift amount τ does not exceed the threshold, the detection unit 15c selects the next smallest value of the processing target value among the time shift amounts calculated by the calculation unit 15b and repeats similar processing.

The conversion unit 15d converts the detected period to the period of an input pulse signal using the unit time. Specifically, the conversion unit 15d converts the value of the period detected by the detection unit 15c to the value of the scale of the input pulse train signal using the unit time determined by the aggregation unit 15a. The conversion unit 15d stores the value of the period converted to the scale of the input pulse train signal in the storage unit 14 as the detected period of the input pulse train signal.

The exclusion unit 15e excludes the pulse train signal having the converted period from the input pulse train signal. In this case, the exclusion unit 15e aggregates the numbers of pulses at respective time points of the converted period of the input pulse train signal to calculate the most frequent value of the numbers of pulses at each time point and excludes the pulses of the most frequent value from the pulse signals of each time point.

That is, the exclusion unit 15e calculates the most frequent value of the numbers of pulses at each time point corresponding to the converted period of the input pulse train signal as a plausible number of pulses having the converted period. The exclusion unit 15e excludes a number of pulses corresponding to the calculated most frequent value from the pulses of each time point. In this way, the pulse train signal having the detected period is excluded from the input pulse train signal.

The exclusion unit 15e inputs the input pulse train signal from which the pulse train signal having the detected period is excluded in the aggregation unit 15a as a new input pulse train signal.

In this manner, the estimation device 10 applies the time shift amount τ in ascending order to repeat the above-described processing. When the calculated autocorrelation value does not exceed the threshold for all time shift amounts τ, the estimation device 10 determines that a pulse train having the period τ is not present in the input pulse train signal. The estimation device 10 outputs all the detected periods of the input pulse train signal stored in the storage unit 14 via the output unit 12 or the communication control unit 13.

In this way, the estimation device 10 detects the pulse train signals while focusing on and starting with the pulse train signal having a short period which is easily distinguished from noise and separates and excludes the same from the input pulse train signal. In the new input pulse train signal from which the pulse train signals having the detected period are excluded, the noise resulting from the pulse train signal having a short period is reduced, and the percentage of the number of pulses in the pulse train signal having a long period occupied in the input pulse train signal increases. Therefore, the estimation device 10 can estimate a relatively long period of the pulse train signal even when signals having a plurality of periods with a large period difference are included in the pulse train signal.

[Estimation Process]

Figure 2:
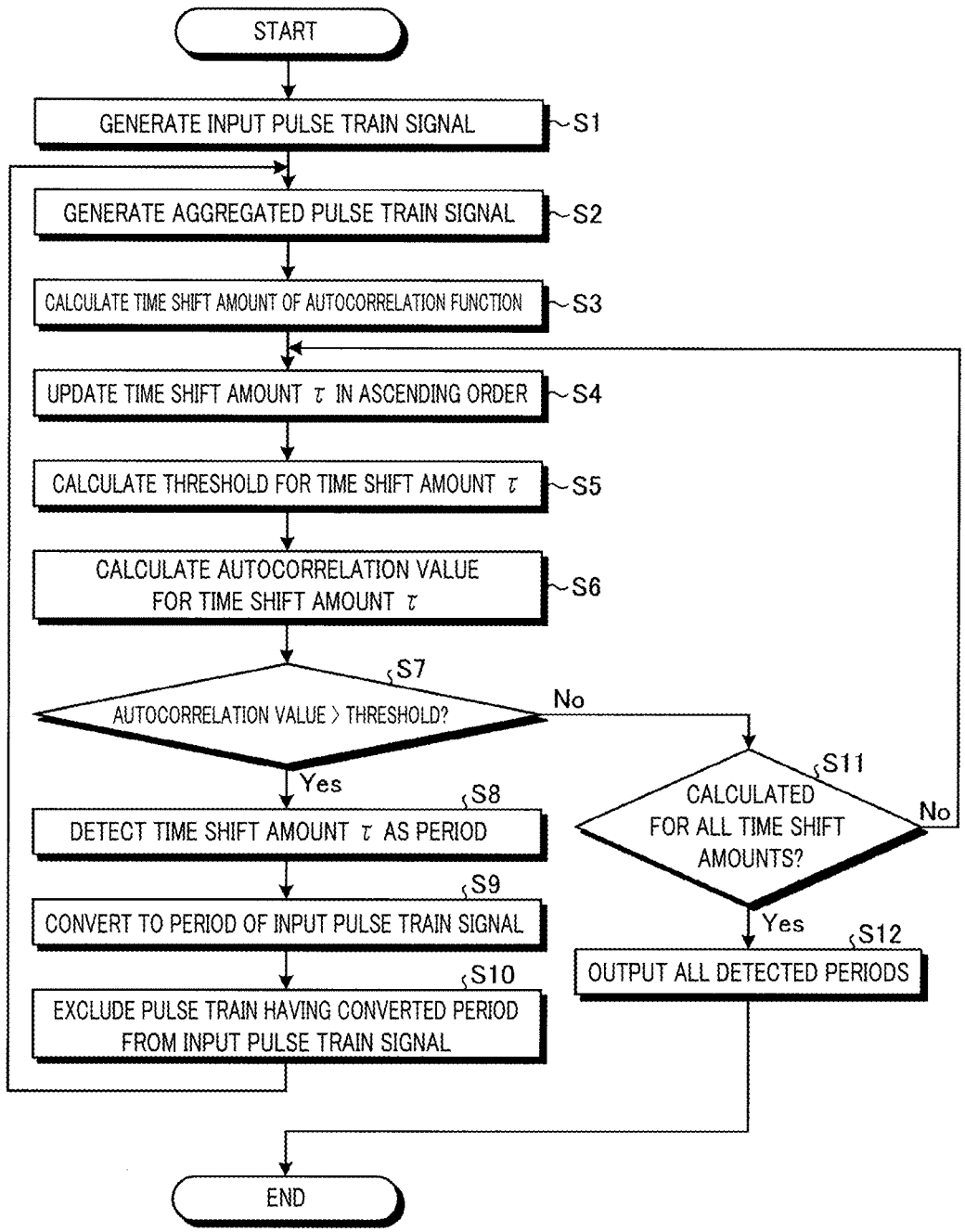
FIG. 2 is a flowchart illustrating an estimation process procedure.
Figure 3:
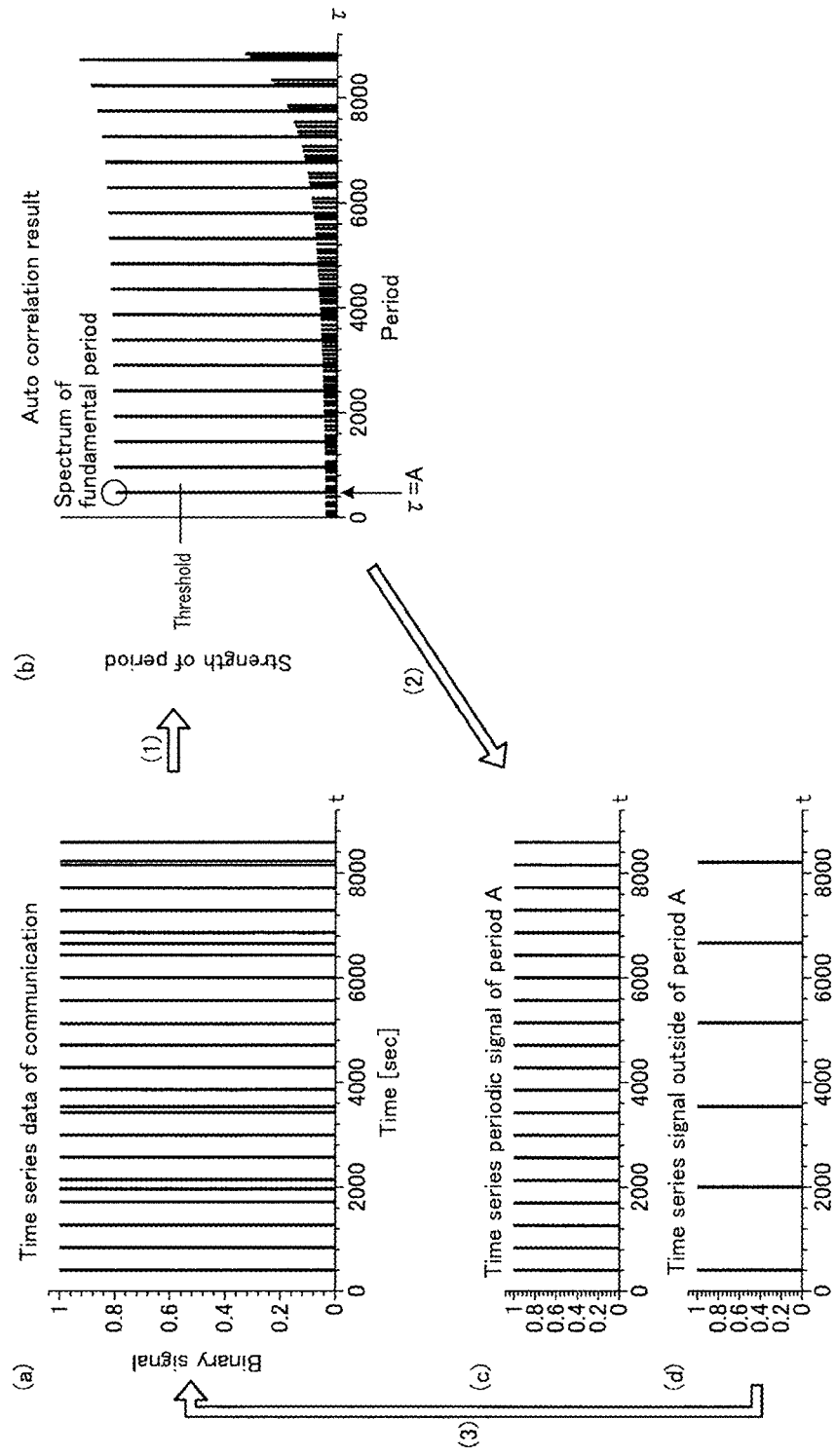
FIG. 3 is a diagram for describing the flow of an estimation process.
Figure 4:
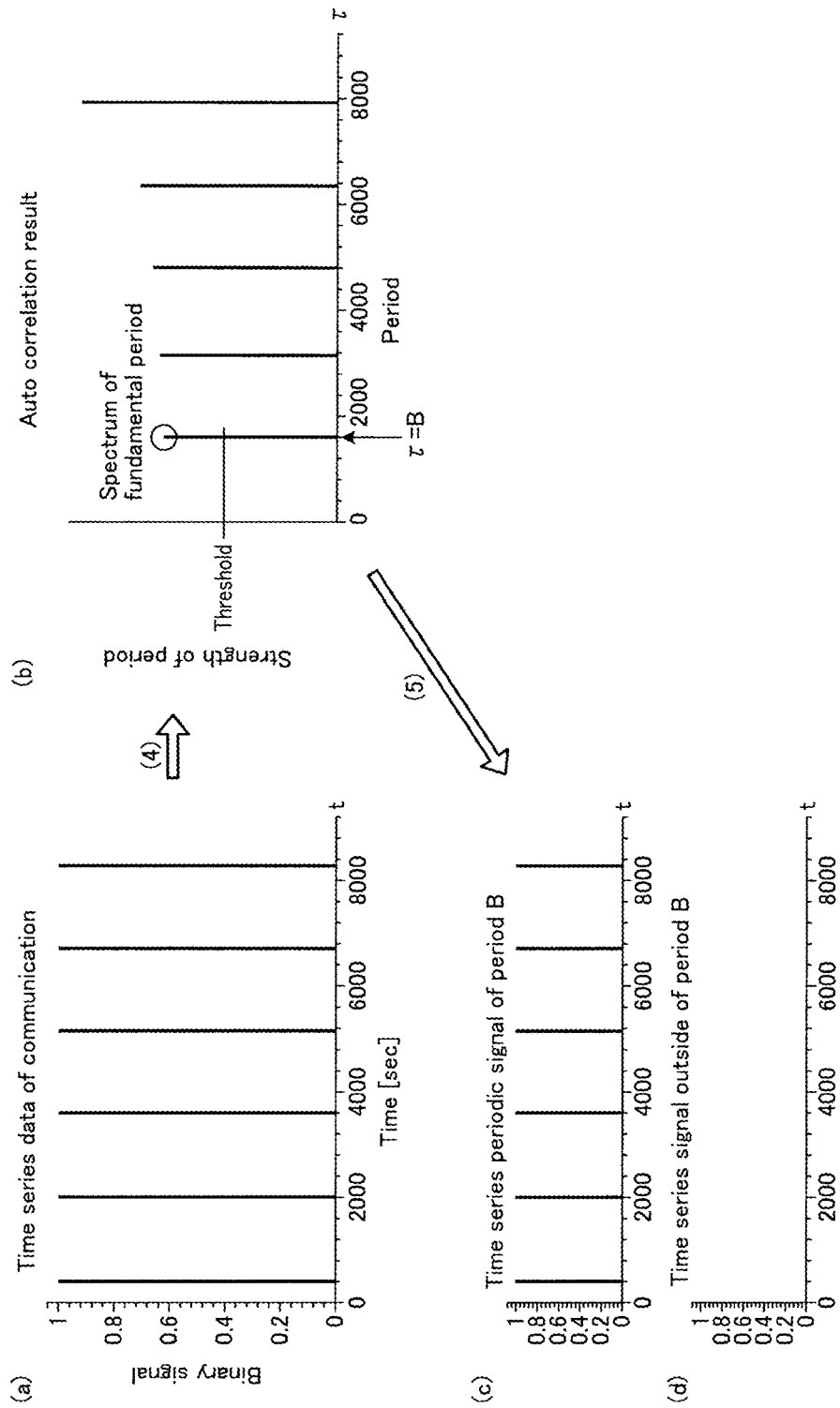
FIG. 4 is a diagram for describing the flow of an estimation process.

Next, the estimation process by the estimation device 10 according to the present embodiment will be described with reference to FIGS. 2 to 4. FIG. 2 is a flowchart illustrating an estimation processing procedure. FIGS. 3 and 4 are diagrams for describing the flow of the estimation process.

The flowchart of FIG. 2 starts at a timing at which a user inputs a start instruction, for example. First, the aggregation unit 15a receives the input of a pulse train signal including a time-series pulse corresponding to a predetermined observation time via the input unit 11 or the communication control unit 13 to generate an input pulse train signal (step S1). For example, the aggregation unit 15a generates an input pulse train signal which is time-series data in which the horizontal axis is time t and the vertical axis is the number of packets using the received pulse train signal corresponding to the observation time.

As illustrated in FIG. 3(a), for example, the input pulse train signal is represented by a number of bars the same as the number of pulses at the time point of generation of pulses, indicating generation of pulses. In the example illustrated in FIG. 3(a), the vertical axis value is 1 when a pulse is present, the vertical axis value is 0 when a pulse is not present, and the number of pulses at time point t is represented by a number of bars (one bar is illustrated at any time point in the drawing) the same as the number of pulses corresponding to the vertical axis value of 1.

Subsequently, the aggregation unit 15a aggregates the pulse intervals of the input pulse train signal and calculates the most frequent value. The aggregation unit 15a determines the unit times on the basis of the most frequent value of the pulse intervals of the input pulse train signal. The aggregation unit 15a aggregates the input pulse train signal for respective unit times to thereby generate an aggregated pulse train signal (step S2 in FIG. 2).

Subsequently, the calculation unit 15b calculates a time shift amount of an autocorrelation function using the aggregated pulse train signal (step S3). Specifically, the calculation unit 15b calculates the pulse intervals of all patterns included in the aggregated pulse train signal as a time shift amount.

Subsequently, the detection unit 15c selects the calculated time shift amounts in ascending order to update a processing target time shift amount τ(step S4).

The detection unit 15c calculates a threshold using a value obtained by dividing the observation time by the time shift amount τ. The detection unit 15c calculates an autocorrelation value with respect to the time shift amount τ (steps S5 to S6 in FIG. 2 and FIG. 3(1)).

The detection unit 15c checks whether the autocorrelation value with respect to the time shift amount τ exceeds the threshold (step S7 in FIG. 2). When the autocorrelation value exceeds the threshold (step S7: Yes), the detection unit 15c determines that a pulse train having the period τ is present (step S8 in FIG. 2 and FIG. 3(b)).

In the example illustrated in FIG. 3(b), τ=A is detected as a period. In the examples illustrated in FIGS. 3 and 4, in order to simplify the description, the conversion of the scale of the input pulse train signal by the aggregation unit 15a is not performed. Therefore, the process by the conversion unit 15d to be described below is not performed, and the value of the period detected herein is used as the detected period of the input pulse train signal as it is.

The conversion unit 15d converts the value of the period detected by the detection unit 15c to the period of the input pulse train signal using the unit time determined by the aggregation unit 15a (step S9 in FIG. 2). The conversion unit 15d stores the value of the period converted to the scale of the input pulse train signal in the storage unit 14 as the detected period of the input pulse train signal.

Subsequently, the exclusion unit 15e separates the pulse train signal having the converted period (FIG. 3(c)) and excludes the same from the input pulse train signal (step S10 in FIG. 2 and FIG. 3(2)). In the example illustrated in FIG. 3, the pulse train signal having period A illustrated in FIG. 3(c) is excluded from the input pulse train signal illustrated in FIG. 3(a) and the pulse train signal illustrated in FIG. 3(d) is obtained.

That is, the exclusion unit 15e aggregates the numbers of pulses for respective time points of the period to calculate the most frequent value of the numbers of pulses at each time point as a plausible number of pulses having the converted period of the input pulse train signal and excludes a number of pulses corresponding to the most frequent value from the pulses of each time point. In this way, the pulse train signal having the detected period is excluded from the input pulse train signal.

The exclusion unit 15e inputs the input pulse train signal illustrated in FIG. 3(d) from which the pulse train signal having the detected period is excluded in the aggregation unit 15a as a new input pulse train signal (step S2 in FIG. 2 and FIG. 3(3)).

The estimation device 10 repeats the same processing as described above as illustrated in FIG. 4. In the example illustrated in FIG. 4, using the pulse train signal illustrated in FIG. 3(d) as the input pulse train signal illustrated in FIG. 4(a), the calculation unit 15b calculates the time shift amount τ of the autocorrelation function, and the detection unit 15c calculates the autocorrelation value and the threshold with respect to the time shift amount τ (FIG. 4(4)).

When the autocorrelation value with respect to the time shift amount τ exceeds the threshold, the detection unit 15c determines that a pulse train having the period τ is present. In the example illustrated in FIG. 4(b), τ=B is detected as a period.

The exclusion unit 15e separates the pulse train signal having the detected period (FIG. 4(c)) and excludes the same from the input pulse train signal (FIG. 4(5)). In the example illustrated in FIG. 4, as illustrated in FIG. 4(d), since all pulse train signals are excluded as the result of exclusion of the pulse train signal having the detected period, a new input pulse train signal is not input to the aggregation unit 15a.

In this manner, the estimation device 10 applies the time shift amount τ in ascending order to repeat the above-described processing. In the process of step S7 in FIG. 2, when the autocorrelation value with respect to the time shift amount τ does not exceed the threshold (step S7: No), the detection unit 15c checks whether processing has been performed for all time shift amounts calculated by the calculation unit 15b (step S11).

When processing has not been performed for all time shift amounts (step S11: No), the detection unit 15c returns to the process of step S4 and updates the processing target time shift amount τ. When processing has been performed for all time shift amounts (step S11: Yes), the detection unit 15c determines that a pulse train having the period τ is not present in the input pulse train signal and outputs all the detected periods of the input pulse train signal stored in the storage unit 14 via the output unit 12 or the communication control unit 13 (step S12). In this way, a series of estimation processes end.

As described above, in the estimation device 10 of the present embodiment, the aggregation unit 15a aggregates an input pulse train signal including a time-series pulse corresponding to a predetermined observation time into pulses for respective predetermined unit times. The calculation unit 15b calculates a time shift amount of an autocorrelation function using the aggregated pulse train signal. The detection unit 15c calculates an autocorrelation value and a threshold with respect to each of the time shift amounts selected in ascending order from the calculated time shift amounts and detects the time shift amount as the period of the aggregated pulse train signal when the autocorrelation value exceeds the threshold. The conversion unit 15d converts the detected period to the period of the input pulse signal using the unit time. The exclusion unit 15e excludes the pulse train signal having the converted period from the input pulse train signal.

In this way, the estimation device 10 detects the pulse train signals while focusing on and starting with the pulse train signal having a short period which is easily distinguished from noise and separates and excludes the same from the input pulse train signal. In the new input pulse train signal from which the pulse train signals having the detected period are excluded, the noise resulting from the pulse train signal having a short period is reduced, and the percentage of the number of pulses in the pulse train signal having a long period occupied in the input pulse train signal increases. Therefore, the estimation device 10 can estimate a relatively long period of the pulse train signal even when signals having a plurality of periods with a large period difference are included in the pulse train signal. In this way, the estimation device 10 can estimate the periods of the pulse train signals including signals having a plurality of periods with high accuracy.

For example, in an OT (Operational Technology) environment such as a building or a plant, a large number of devices often perform a periodic operation such as checking life and death and checking the device status at regular intervals on the basis of a program defined in advance. In such an environment, the estimation device 10 can estimate the number of periodic operation programs operating in a network device by estimating the communication period of the network device in communication and counting the number of different communication periods. The estimation device 10 can detect an abnormality by detecting a change in the period.

[Program]

A program that describes processing executed by the estimation device 10 according to the embodiment in a computer-executable language may be created. As an embodiment, the estimation device 10 can be implemented by installing a detection program that executes the detection process as package software or online software in a desired computer. For example, by causing an information processing device to execute the detection program, the information processing device can function as the estimation device 10. The information processing device mentioned herein includes a desktop or laptop-type personal computer. In addition, mobile communication terminals such as a smartphone, a cellular phone, or a PHS (Personal Handyphone System), slate terminals such as PDA (Personal Digital Assistant), and the like are included in the category of the information processing device. Furthermore, the estimation device 10 may be implemented in a cloud server.

Figure 5:
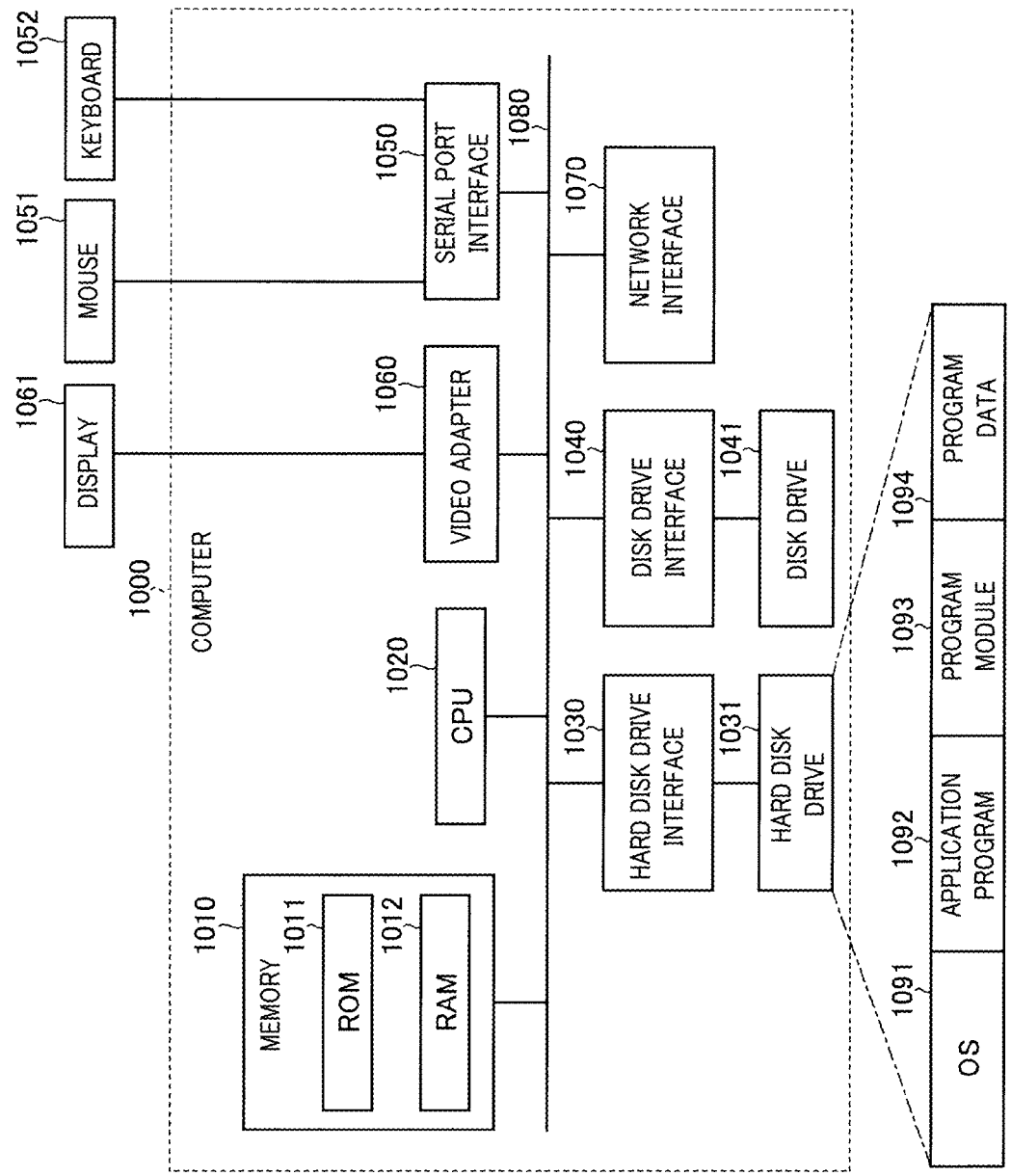
FIG. 5 is a diagram illustrating a computer executing an estimation program.

FIG. 5 is a diagram illustrating an example of a computer that executes the estimation program. A computer 1000 includes, for example, a memory 1010, a CPU 1020, a hard disk drive interface 1030, a disk drive interface 1040, a serial port interface 1050, a video adapter 1060, and a network interface 1070. These elements are connected by a bus 1080.

The memory 1010 includes a ROM (Read Only Memory) 1011 and a RAM 1012. The ROM 1011 stores a boot program such as BIOS (Basic Input Output System), for example. The hard disk drive interface 1030 is connected to a hard disk drive 1031. The disk drive interface 1040 is connected to a disk drive 1041. A removable storage medium such as a magnetic disk or an optical disc is inserted into the disk drive 1041. A mouse 1051 and a keyboard 1052, for example, are connected to the serial port interface 1050. For example, a display 1061 is connected to the video adapter 1060.

Here, the hard disk drive 1031 stores an OS 1091, an application program 1092, a program module 1093, and program data 1094, for example. Various types of information described in the embodiment are stored in the hard disk drive 1031 and the memory 1010, for example.

The estimation program is stored in the hard disk drive 1031 as the program module 1093 in which commands executed by the computer 1000 are described, for example. Specifically, the program module 1093 in which respective processes executed by the estimation device 10 described in the embodiment are described is stored in the hard disk drive 1031.

The data used for information processing by the estimation program is stored in the hard disk drive 1031, for example, as the program data 1094. The CPU 1020 reads the program module 1093 and the program data 1094 stored in the hard disk drive 1031 into the RAM 1012 as necessary and performs the above-described procedures.

The program module 1093 and the program data 1094 related to the estimation program are not limited to being stored in the hard disk drive 1031, and for example, may be stored in a removable storage medium and be read by the CPU 1020 via the disk drive 1041 and the like. Alternatively, the program module 1093 and the program data 1094 related to the estimation program may be stored in other computers connected via a network such as a LAN or a WAN (Wide Area Network) and be read by the CPU 1020 via the network interface 1070.

While an embodiment to which the invention made by the present inventor has been described, the present invention is not limited to the description and the drawings which form a part of the disclosure of the present invention according to the present embodiment. That is, other embodiments, examples, operation techniques, and the like performed by those skilled in the art based on the present embodiment fall within the scope of the present invention.

REFERENCE SIGNS LIST

10 Estimation device
11 Input unit
12 Output unit
13 Communication control unit
14 Storage unit
15 Control unit
15*a* Aggregation unit
15*b* Calculation unit
15*c* Detection unit
15*d* Conversion unit
15*e* Exclusion unit

The invention claimed is:

1. An estimation device, comprising:
aggregation circuitry that aggregates an input pulse train signal including a time-series pulse corresponding to a predetermined observation time into pulses for a unit time;
calculation circuitry that calculates a time shift amount of an autocorrelation function using the aggregated pulse train signal;
detection circuitry that calculates an autocorrelation value and a threshold with respect to each of time shift amounts selected in ascending order from the calculated time shift amount and detects the time shift amount as a period of the aggregated pulse train signal when the autocorrelation value exceeds the threshold;
conversion circuitry that converts the detected period to a period of the input pulse train signal using the unit time; and
exclusion circuitry that excludes the pulse train signal having the converted period from the input pulse train signal.

2. The estimation device according to claim 1, wherein:
the aggregation circuitry determines the unit time on the basis of a most frequent value of pulse intervals of the input pulse train signal and aggregates the input pulse train signal for the unit time.

3. The estimation device according to claim 1, wherein:
the calculation circuitry calculates a pulse interval of all patterns included in the pulse train signal as the time shift amount.

4. The estimation device according to claim 1, wherein:
the detection circuitry calculates the threshold using a value obtained by dividing the predetermined observation time by the time shift amount.

5. The estimation device according to claim 1, wherein:
the exclusion circuitry aggregates the number of pulses at each time point of the converted period to calculate a most frequent value of the numbers of pulses at each time point and excludes a number of pulses corresponding to the most frequent value from the pulses of each time point.

6. An estimation method, comprising:
aggregating an input pulse train signal including a time-series pulse corresponding to a predetermined observation time into pulses fora unit time;
calculating a time shift amount of an autocorrelation function using the aggregated pulse train signal;
calculating an autocorrelation value and a threshold with respect to each of time shift amounts selected in ascending order from the calculated time shift amount and detecting the time shift amount as a period of the aggregated pulse train signal when the autocorrelation value exceeds the threshold;
converting the detected period to a period of the input pulse train signal using the unit time; and
excluding the pulse train signal having the converted period from the input pulse train signal.

7. The estimation method according to claim 6, wherein:
the aggregating determines the unit time on the basis of a most frequent value of pulse intervals of the input pulse train signal and aggregates the input pulse train signal for the unit time.

8. The estimation method according to claim 6, wherein:
the calculating the time shift calculates a pulse interval of all patterns included in the pulse train signal as the time shift amount.

9. The estimation method according to claim 6, wherein:
the calculating the autocorrelation value and the threshold calculates the threshold using a value obtained by dividing the predetermined observation time by the time shift amount.

10. The estimation method according to claim 6, wherein:
the excluding aggregates the number of pulses at each time point of the converted period to calculate a most frequent value of the numbers of pulses at each time point and excludes a number of pulses corresponding to the most frequent value from the pulses of each time point.

11. A non-transitory computer readable medium storing estimation program for causing a computer to execute:
aggregating an input pulse train signal including a time-series pulse corresponding to a predetermined observation time into pulses for a unit time;
calculating a time shift amount of an autocorrelation function using the aggregated pulse train signal;
calculating an autocorrelation value and a threshold with respect to each of time shift amounts selected in ascending order from the calculated time shift amount and detecting the time shift amount as a period of the aggregated pulse train signal when the autocorrelation value exceeds the threshold;
converting the detected period to a period of the input pulse train signal using the unit time; and
excluding the pulse train signal having the converted period from the input pulse train signal.

12. The non-transitory computer readable medium according to claim 11, wherein:
the aggregating determines the unit time on the basis of a most frequent value of pulse intervals of the input pulse train signal and aggregates the input pulse train signal for the unit time.

13. The non-transitory computer readable medium according to claim 11, wherein:
the calculating the time shift calculates a pulse interval of all patterns included in the pulse train signal as the time shift amount.

14. The non-transitory computer readable medium according to claim 11, wherein:
the calculating the autocorrelation value and the threshold calculates the threshold using a value obtained by dividing the predetermined observation time by the time shift amount.

15. The non-transitory computer readable medium according to claim 11, wherein:
the excluding aggregates the number of pulses at each time point of the converted period to calculate a most frequent value of the numbers of pulses at each time point and excludes a number of pulses corresponding to the most frequent value from the pulses of each time point.

* * * * *